(12) United States Patent
Tung

(10) Patent No.: US 6,319,776 B1
(45) Date of Patent: Nov. 20, 2001

(54) FORMING HIGH VOLTAGE COMPLEMENTARY SEMICONDUCTOR DEVICE (HV-CMOS) WITH GRADIENT DOPING ELECTRODES

(75) Inventor: Ming-Tsung Tung, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/310,238

(22) Filed: May 12, 1999

(51) Int. Cl.[7] .................. H01L 21/336; H01L 31/113; H01L 29/94
(52) U.S. Cl. .............. 438/270; 438/271; 438/272; 257/332; 257/333
(58) Field of Search ................ 257/65, 195, 204, 257/206, 209, 212, 268, 526, 554; 438/155, 309, 314, 199, 128, 129, 153, 154, 271, 272, 270

(56) References Cited

U.S. PATENT DOCUMENTS

| | | | |
|---|---|---|---|
| 4,830,975 | * 5/1989 | Bovaird et al. | 437/41 |
| 5,559,357 | * 9/1996 | Krivokapic | 257/336 |
| 5,736,435 | * 4/1998 | Venkatesan et al. | 438/151 |
| 5,888,880 | * 3/1999 | Gardner et al. | 438/424 |
| 5,937,297 | * 8/1999 | Peidous | 438/270 |
| 6,133,606 | * 10/2000 | Tung | 257/332 |
| 6,201,278 | * 3/2001 | Gardner et al. | 257/330 |

* cited by examiner

Primary Examiner—Olik Chaudhuri
Assistant Examiner—Shrinivas H. Rao

(57) ABSTRACT

A method for fabricating high voltage semiconductor devices having a gradient doping of a drift region which comprises N-well 1 and N-well 2 with two different doping densities. This method results in the lift in device's current drive capability and as well as its breakdown voltage. The method further comprises forming a buried spacer oxide, serving as a point of exertion for the edges of the buried gate electrode. And finally, the extension in channel length and the placement of both the channel and drift regions change to vertical direction, all of those result in a greater reduction in the occupied chip area. These advantages attribute to the formation of a buried gate electrode by trench etching method.

17 Claims, 4 Drawing Sheets

FORMING HIGH VOLTAGE COMPLEMENTARY SEMICONDUCTOR DEVICE (HV-CMOS) WITH GRADIENT DOPING ELECTRODES

BACKGROUND OF THE INVENTION

1. Field of the Invention

The present invention relates to a method for forming semiconductor devices, and more particularly relates to a method for fabricating devices having an enhancement in high current drive capability and a diminishment in the area occupied by devices.

2. Description of the Prior Art

Given the present developments and changes in technology, integrated circuits (ICs) are gradually moving toward an ultra-high density target. Therefore, there is a trend toward the gradual diminishment in semiconductor device sizes and distances between devices. Thus, no matter how tiny devices integrated become, it is still very important to maintain the best operating condition within the devices. Conventional structures of high voltage CMOS (HV-CMOS) devices have channels and drift regions in the horizontal direction, which results in a larger chip area occupation. Therefore, a better and more advanced method for fabricating devices is needed urgently.

FIG. 1A shows a cross-sectional view of a structure of a conventional CMOS transistor. The structure comprises a p-type conductivity substrate 10, a $N^+$ source electrode 11, a $N^+$ drain electrode 12, a drift region 13, a field oxide (FOX) layer 14, a gate oxide layer 15, and a gate electrode 16.

In the structure of a conventional CMOS transistor described above, channel and drift regions are all the in horizontal direction and only source and drain electrode are located inside the substrate. This type of structure makes channel and drift regions of CMOS seems shorter in length. When the channel of CMOS device shrinks in length, hot carrier effects become more serious. There are many ways to solve hot carrier effects for short channel length CMOS devices. Wherein the simplest method is to reduce CMOS transistor's operating voltage. For example, 5V is reduced to 3.3V or even 2.5V, this reduces the channel's horizontal electric field and results in an ability to form any hot carrier. Although the phenomena of "carrier multiples" can be greatly reduced, the device would not be able to be used under high voltage operations. If it is desired to avoid reducing the operating voltage for CMOS transistors and also to solve hot carrier effects for short channel length CMOS devices, then the channel length of CMOS devices need to be increased. The structure in horizontal direction and an increase in the channel length would all occupy a greater chip area, which is against the trend of gradual diminishment of size in semiconductor devices.

Another method that is popular in solving hot carrier effects for short channel length CMOS devices is placing an N− type region with lower doping density at the place where the source/drain region draws near the channel. This kind of design has been called "Lightly Doped Drain", or LDD. The use of LDD is not a perfect solution. First of all, LDD makes CMOS fabrication more complicated. Next, due to the lower doping density of LDD, the series resistance between the source and drain would be higher. This causes a reduction in the device's operating speed and an increment in power dissipation.

SUMMARY OF THE INVENTION

The main objective of the present invention is to provide a method for fabricating high voltage semiconductor devices having a gradient doping for the drift regions that substantially enhanced the device's current drive capability and its breakdown voltage. In addition, according to the present invention, spacer oxide is used to act as the point of exertion for the edges of polysilicon gate in avoiding breakdown voltage from occuring in advance. Moreover, change the geometrical placement of device's channel and drift regions is changed from the conventional horizontal direction to vertical direction, which results in a greater reduction in the occupied chip area.

The present invention relates to a method for forming of a transistor device, where the resulting structure of the present invention is shown in FIG. 1B. Firstly, a p-type semiconductor substrate 100 is provided, followed by the forming a first trench 140 within the substrate. Next, a pair of source (200, 130, and 120) and drain (210, 131, and 121) region are formed just right beside the first trench 140.

Within the pair of source and drain region, there is formed a first doping region 120 and 121. Also, within the same pair of source and drain region, there is formed a second doping region 130 and 131 that is directly above the first doping region. The pair of source and drain regions is not completed without the formation of a third doping region 200 and 210, which is directly above the second doping region.

The method for fabricating the device further comprises the formation of a second trench 170 and follows a spacer 160 formation on top of a sidewall of the first trench 140, and also occupies a portion of the bottom of the first trench. A gate oxide layer 180 is formed on the top of both sidewalls and the bottom surface of the second trench 170. And finally, a buried gate electrode is formed on top of the gate oxide layer and also fills up both the first trench and the second trench.

The method for fabricating the special structure of the present invention mentioned above comprises the following advantages. First of all, a trench etching method is used to place a gate electrode and spacers and also to change the geometrical placement of device's channel and drift regions from horizontal direction to the vertical direction, all of those making a contribution to a greater reduction in the occupied chip area.

Secondly, the channel length increases in relation to the formation of the gate electrode by a trenching method. Hot carrier effects would be reduced in a great proportion due to this extension in the channel length.

Thirdly, in the field of source/drain doping density, if the first doping region and the second doping region have the same doping density and both are low, the device is capable of handling high voltages but its current drive capability is weaker. If the first doping region and the second doping region have same doping density and both are high, the device is not capable in handling high voltages but its current drive capability is stronger. Therefore, the present invention uses different doping densities, from low to high, to form a complementary structure in solving the above defects and also for lifting the breakdown voltage.

Finally, the placement of spacers in the present invention can avoid breakdown voltage from occurring in advance, that is to make sure that the topper upper layers will not breakdown before lower layers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
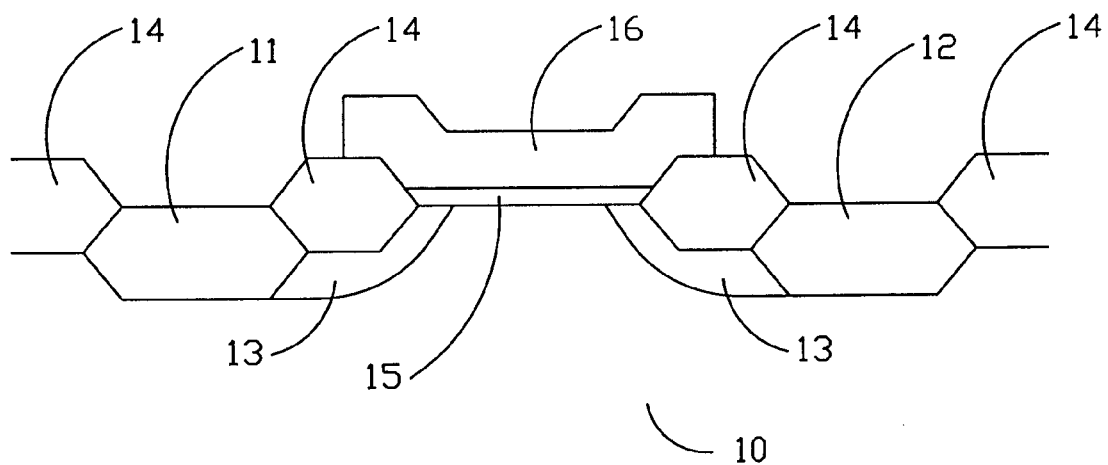
FIG. 1A is a cross-sectional view of a CMOS having a conventional source/drain region.
Figure 1B:
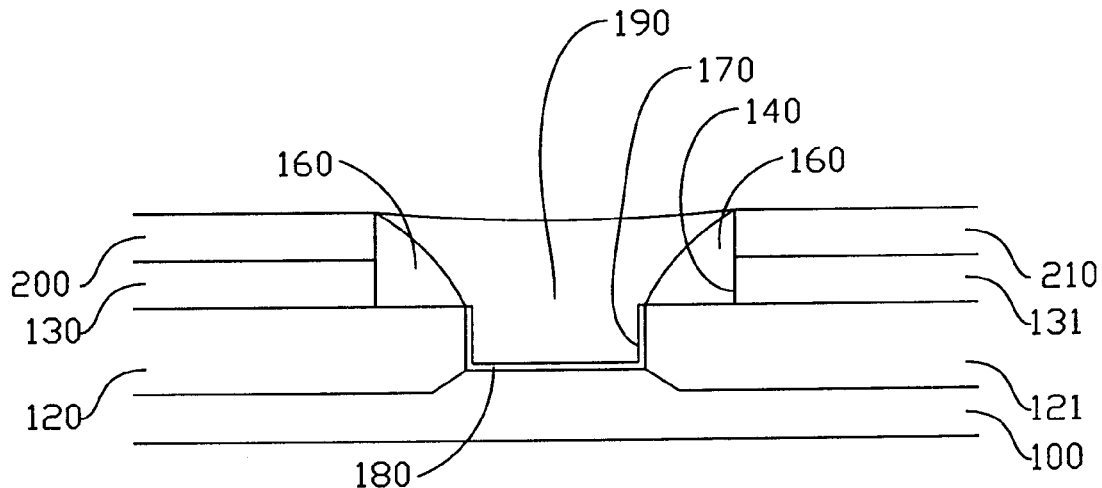
FIG. 1B shows a cross-sectional view of a preferred embodiment of the present invention.
Figure 2A:
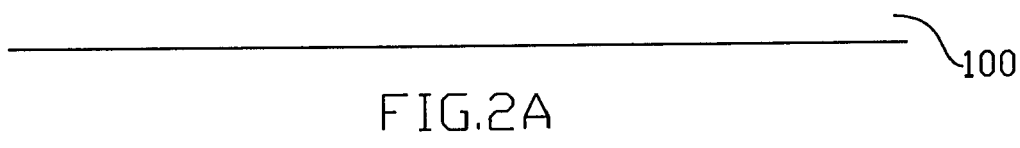
FIG. 2A to FIG. 2K are cross-sectional views respectively illustrating a method for fabricating another preferred embodiment of the present invention.

A preferred embodiment of the present invention provides a method for forming of a high voltage complementary metal oxide semiconductor (HV-CMOS) with a gradient doping source/drain region. A method for fabricating the semiconductor device is illustrated in FIG. 2A to FIG. 2K. Firstly, a p-type conductivity semiconductor substrate 100 is provided, as shown in FIG. 2A.

Figure 2B:
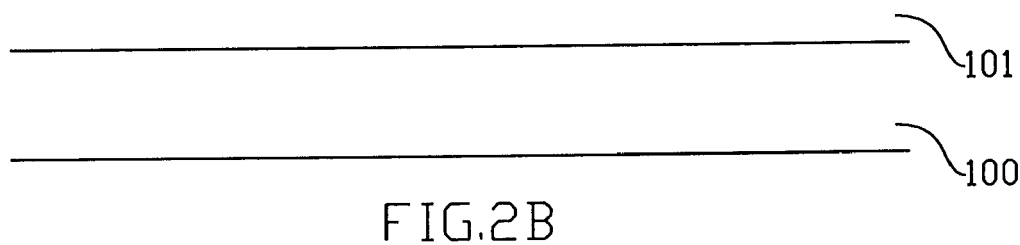

FIG. 2B shows an optional inclusion of a p-type epitaxial (p-epi) semiconductor substrate 101 within the substrate 100, which function to prevent latch up from occuring within CMOS devices. However, in order to simplify the structure of the present invention the p-epi semiconductor substrate 101 will not be included in the following device structures.

Figure 2C:

In FIG. 2C, a silicon oxide layer 110 is formed on top of the substrate 100 using Plasma Enhanced Chemical Vapor Deposition (PECVD). The thickness of the silicon oxide layer 110 is between 900 angstroms and 3500 angstroms. The silicon oxide layer 110 can be formed using any type of chemical vapor deposition, such as APCVD or LPCVD, and is not restricted to PECVD. This silicon oxide layer 110 acts as a mask for ion implantation or thermal diffusion, which protects the chip surface in reducing the sacrificial layer of the destruction caused by ion implantation.

Figure 2D:
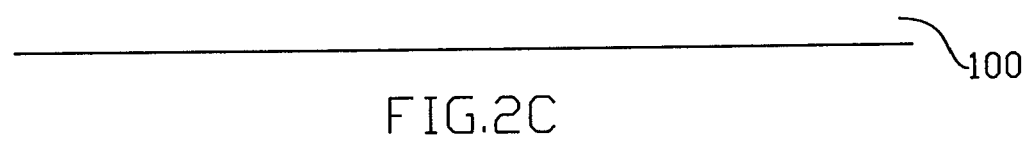

FIG. 2D illustrates the use of well-know photolithography technology to decide the exact locations of a first doping region (N-well 1) 120 and 121 of source/drain region. Then, thermal diffusion to drive in a first dopant, wherein the conductivity type of the first dopant is opposite to the conductivity type of the substrate.

Figure 2E:
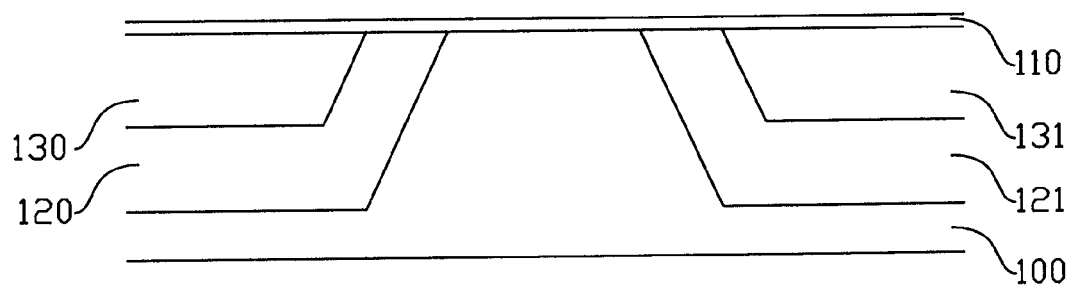

Sequentially, as shown in FIG. 2E, the same procedure as used in FIG. 2D to form a second doping region (N-well 2) 130 and 131 of source/drain region. The conductivity type of a second dopant is the same as the conductivity type of the first doping region. Moreover, the doping density of the second doping region is higher than the doping density of the first doping region.

Figure 2F:
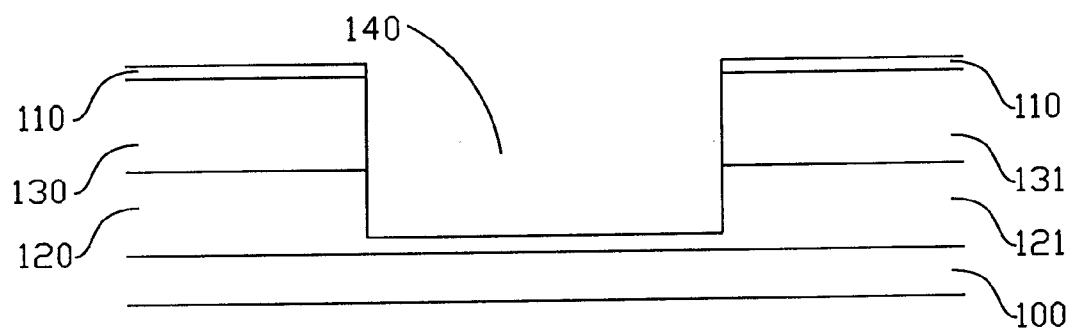

In FIG. 2F, a masking is layer formed and uses the trench isolation method to pattern out a first trench 140. The depth of the first trench is almost equivalent to the depth of N-well 1 but does not exceed that depth.

Figure 2G:
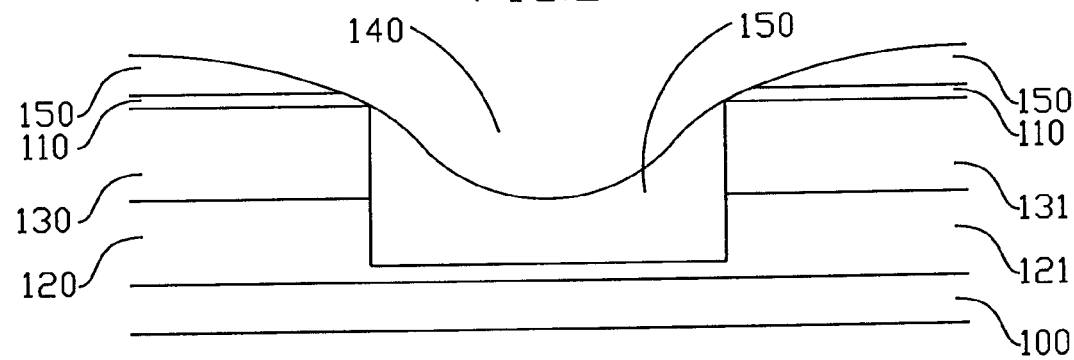

Next, as shown in FIG. 2G, a silicon oxide layer 150 or a silicon nitride layer is formed falong an exposed surface of the resulting structure by using conformal type deposition method. The oxide layer covers the bottom surface and the sidewalls of the first trench 140 as well as the topmost surface of the source/drain region. This oxide layer should not be formed using any chemical vapor deposition method, otherwise the whole first trench 140 would be filled up and hence would affect the contact area of a gate electrode in later stages. Therefore, structures with higher glutinous characteristic and lower mobility should be used.

Figure 2H:
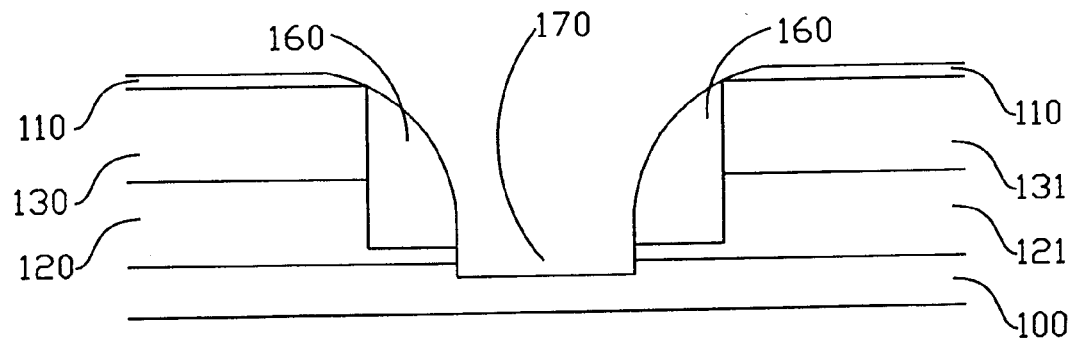

In FIG. 2H, the etching back a portion of the silicon oxide layer that is on the top surface of the source/drain region to expose the surface of another silicon oxide layer 110 is illustrated. Subsequently a masking layer is formed and the trench isolation method is used to pattern out a second trench 170 within the first trench and inside the substrate 100. The depth of the second trench 170 is deeper inside the substrate than the depth of the first trench and the width of the second trench is narrower than the width of the first trench. After the formation of the second trench 170, there formed a spacer 160 on the sidewall and a portion of the bottom surface of the first trench. This spacer acts as an isolating layer and functions as a point of exertion for edges of a gate electrode.

Figure 2I:
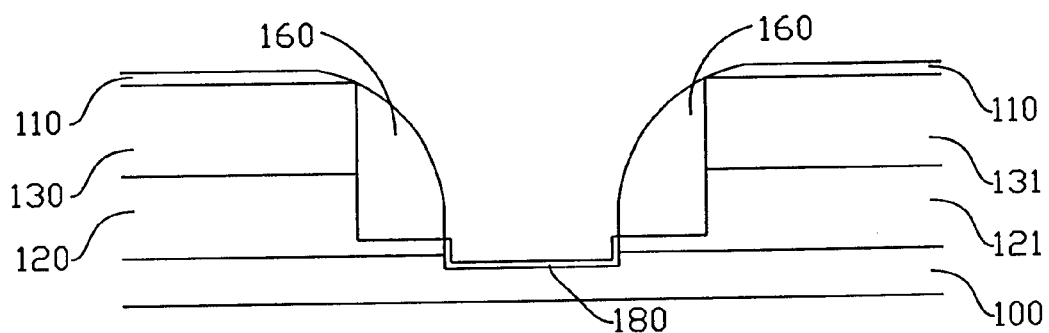

As shown in FIG. 2I, a gate oxide layer 180 is formed along the edge of sidewalls and the bottom surface of the second trench.

Figure 2J:
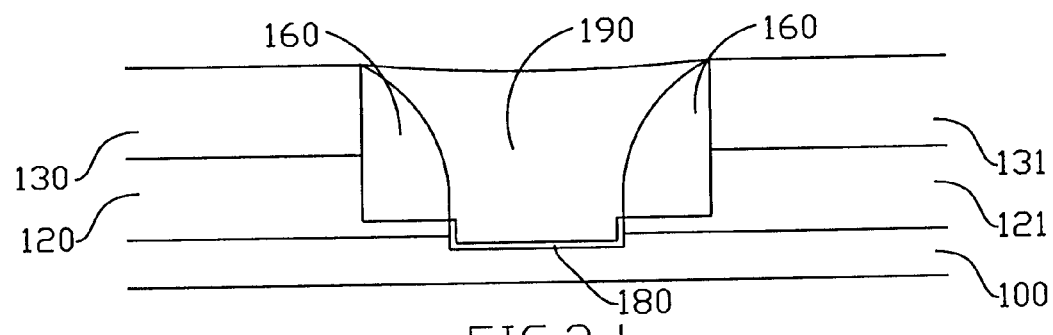

Subsequently, as shown in FIG. 2J, the silicon oxide layer 110 is removed, shown in FIG. 2I, from the top of the source/drain region to expose the surface of N-well 2. Thereafter, LPCVD is used to form a $N^+$ type doped polysilicon layer and to overlay the entire exposed surface of the resulting structure as well as to fill up the first trench and the second trench. Then, the polysilicon layer is etched back to form a buried gate electrode 190, wherein an exposed surface of the gate electrode 190 is almost equivalent in height to the exposed surface of N-well 2. Furthermore, the buried gate electrode can also be formed using a polysilicon compound or other metallic material.

Figure 2K:
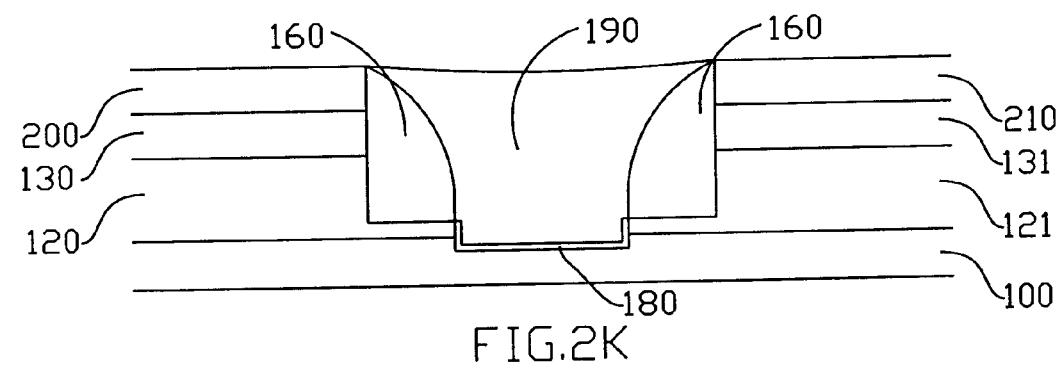

Finally, as shown in FIG. 2K, thermal diffusion is used to drive-in ions with a third doping density and to form a third doping region inside the source/drain region. This forms a $N^+$ type source electrode 200 and a $N^+$ type drain electrode 210. The top surface of the third doping region is also the uppermost surface of the source/drain region. The conductivity type of a third dopant is the same as the conductivity type of the second doping region, furthermore, the doping density of the third doping region is higher than the doping density of the second doping region. FIG. 2K only represents a semiconductor structure of an embodiment of the present invention. This structure not only reduces the occupied chip area, but also provides an enhancement in high current drive capability as well as the breakdown voltage.

Figure 2L:
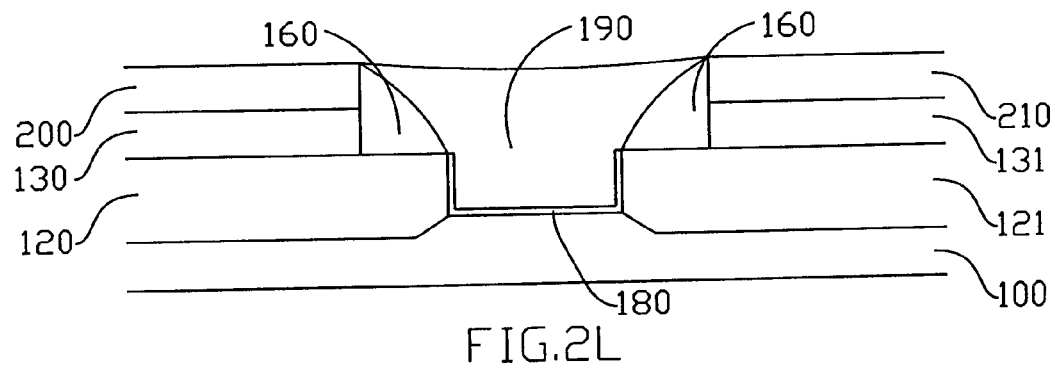
FIG. 2L is the same as FIG. 1B.

Another preferred embodiment of the present invention is shown in FIG. 2L, wherein the structure is very similar to the structure of the previous embodiment shown in FIG. 2K. There are a few differences. First the depth of the first trench 140 is equal to the depth of the second doping region 130 and 131, where instead in FIG. 2K it is at a level slightly higher than the bottom of the first doping region 120 and 121. Second, the depth of the second trench is slightly above the bottom of the first doping region, where instead in FIG. 2K it is slightly below the bottom of the first doping region. As a result of these, differences both buried gate electrode 190 and spacer 160 occupy a smaller volume as compared with the previous embodiment shown in FIG. 2K.

In spite of the slight differences in the two structures shown in FIG. 2K and FIG. 2L of the preferred embodiment of the present invention, they perform exactly the same functions and have the same advantages.

Although specific embodiments have been illustrated and described, it will be obvious to those skilled in the art that various modifications may be made without departing from what is intended to be limited solely by the appended claims.

What is claimed is:

1. A method for forming high voltage semiconductor devices, comprising:

providing a semiconductor substrate;

overlaying an oxide layer on top of an exposed surface of said substrate;

forming a pair of source and drain region, said pair further comprises forming a first doping region within said pair of source and drain region, the conductivity type of a first dopant of said first doping region is opposite to the conductivity type of said substrate;

forming a second doping region within said pair of source and drain region and on top of said first doping region, the conductivity type of a second dopant of said second doping region is same as the conductivity type of said first doping region, moreover, a doping density of said second doping region is higher than a doping density of said first doping region;

forming a third doping region within said pair of source and drain region and on top of said second doping region, the conductivity type of a third dopant of said third doping region is same as the conductivity type of said second doping region, moreover, a doping density of said third doping region is higher than the doping density of said second doping region;

forming a first trench and a second trench inside said substrate and at a same location;

forming a spacer on top of a sidewall of said first trench;

forming a gate oxide layer on top of both sidewalls and a bottom surface of said second trench; and forming a buried gate electrode on top of said gate oxide layer and also filled up said first trench and said second trench, wherein the top surface of said buried gate electrode having almost an equal height as the uppermost surface of said pair of source and drain region.

2. The method in accordance with claim 1, wherein said semiconductor substrate can selectively comprise epitaxial silicon.

3. The method in accordance with claim 2, wherein said semiconductor substrate having p-type conductivity.

4. The method in accordance with claim 1, wherein said oxide layer comprises silicon oxide.

5. The method in accordance with claim 1, wherein said oxide layer can be formed by using any type of Chemical Vapor Deposition (CVD), such as APCVD, LPCVD, or PECVD.

6. The method in accordance with claim 1, wherein said first trench is formed by an etching procedure, a depth of said first trench is in between a bottom depth of said third doping region and a bottom depth of said first doping region.

7. The method in accordance with claim 1, wherein said second trench is formed by an etching procedure, a depth of said second trench is deeper inside said substrate than said first trench, and the width of said second trench is smaller than the width of said first trench.

8. The method in accordance with claim 7, wherein the depth of said second trench can either be slightly above or slightly below the bottom depth of said first doping region.

9. The method in accordance with claim 1, wherein said spacer is an insulating layer formed by using a conformal type deposition and etching back.

10. The method in accordance with claim 9, wherein said insulating layer is formed within said substrate which uses as a point of exertion for edges of said buried gate electrode.

11. The method in accordance with claim 9, wherein said insulating layer is placed in between said source/drain region and said buried gate electrode.

12. The method in accordance with claim 9, wherein said insulating layer comprises one of the following: silicon oxide, silicon nitride.

13. The method in accordance with claim 1, wherein said buried gate electrode comprises one of the following: polysilicon, polysilicon compound, metal.

14. The method in accordance with claim 1, wherein said forming a buried gate electrode comprises a procedure for polysilicon gate electrode deposition.

15. The method in accordance with claim 14, wherein said procedure for polysilicon gate electrode deposition comprises:

deposing a polysilicon conductive layer on top of an exposed surface portion of the resulting structure and filling up said first trench and said second trench;

etching back said conductive layer to expose the surface of said pair of source and drain region.

16. The method in accordance with claim 1, wherein said pair of source and drain region is formed by a procedure of ion drive-in.

17. The method in accordance with claim 1, wherein said first, second, and third dopant are selected from the group consisting of As, P, and B.

* * * * *